United States Patent [19]
Kotecki et al.

[11] Patent Number: 6,002,575
[45] Date of Patent: Dec. 14, 1999

[54] ADHERENT SEPARATOR FOR SELF-DEFINING DISCONTINUOUS FILM

[75] Inventors: David E. Kotecki, Hopewell Junction; William H. Ma, Fishkill, both of N.Y.

[73] Assignee: International Business Machines Corporation, Armonk, N.Y.

[21] Appl. No.: 08/865,534

[22] Filed: May 29, 1997

[51] Int. Cl.[6] .............. H01G 4/06; H01G 4/20; H01G 4/10
[52] U.S. Cl. .......... 361/311; 361/312; 361/313; 361/301.4; 361/321.5; 257/303; 257/306
[58] Field of Search .................. 361/305, 303, 361/306.1, 301.4, 311, 312, 313, 321.1, 321.4, 321.5, 322, 512; 438/296, 295, 305, 306, 307, 240, 244, 247, 250, 251–253, 258, 239, 238; 257/295, 296, 301, 303, 306, 309, 310, 528, 532

[56] References Cited

U.S. PATENT DOCUMENTS

| | | | |
|---|---|---|---|
| 5,143,861 | 9/1992 | Turner | 437/52 |
| 5,335,138 | 8/1994 | Sandhu et al. | 361/303 |
| 5,381,302 | 1/1995 | Sandhu et al. | 361/305 |
| 5,392,189 | 2/1995 | Fazan et al. | 361/305 |
| 5,416,042 | 5/1995 | Beach et al. | 437/60 |
| 5,418,180 | 5/1995 | Brown et al. | 437/60 |
| 5,436,477 | 7/1995 | Hashizume et al. | 257/310 |
| 5,478,772 | 12/1995 | Fazan et al. | 437/60 |
| 5,489,548 | 2/1996 | Nishioka et al. | 437/60 |
| 5,504,041 | 4/1996 | Summerfelt | 437/235 |
| 5,506,166 | 4/1996 | Sandhu et al. | 437/60 |
| 5,534,458 | 7/1996 | Okudaira et al. | 437/52 |
| 5,550,076 | 8/1996 | Chen et al. | 437/52 |
| 5,554,564 | 9/1996 | Nishioka et al. | 437/192 |
| 5,721,168 | 2/1998 | Wu et al. | 438/253 |
| 5,744,833 | 4/1998 | Chao | 257/308 |
| 5,763,304 | 6/1998 | Tseng | 438/239 |
| 5,869,861 | 2/1999 | Chen | 257/308 |

*Primary Examiner*—Kristine Kincaid
*Assistant Examiner*—Eric W. Thomas
*Attorney, Agent, or Firm*—Alison D. Mortinger; Jay H. Anderson

[57] ABSTRACT

An adherent separator structure with a post projecting from a surface which may be a substrate, and a separator adhering to the post, the separator spaced a distance above the surface. A discontinuous film is then formed in a single process step having a first portion on the substrate and a second portion on the post, the discontinuity proximate to and caused by the separator. The structure is made into a stacked capacitor with the second (post) portion of the discontinuous film being the bottom electrode, by forming a continuous dielectric layer on the bottom electrode and a continuous top electrode layer on the dielectric layer.

19 Claims, 2 Drawing Sheets

ADHERENT SEPARATOR FOR SELF-DEFINING DISCONTINUOUS FILM

RELATED APPLICATIONS

This invention is related to copending U.S. patent applications Ser. No. 08/865,533, titled "Overhanging Separator for Self-Defining Stacked Capacitor," Ser. No. 08/865,528, titled "Overhanging Separator for Self-Defining Discontinuous Film", and Ser. No. 08/865,529, titled "Trench Separator for Self-Defining Discontinuous Film", all filed on the same day and assigned to the present assignee.

FIELD OF THE INVENTION

This invention is directed to semiconductor films and the manufacture of the same, more particularly to a self-defining discontinuous film, and most particularly to a capacitor employing a self-defining bottom electrode.

BACKGROUND OF THE INVENTION

Stacked capacitor structures using high-dielectric materials such as $(Ba,Sr)TiO_3$ (BST) require noble metal electrodes, such as platinum, which are very difficult to pattern using conventional semiconductor processing such as reactive ion etching (RIE), ion beam etching, or chemical-mechanical polishing (CMP). Therefore there is a need for a capacitor structure which does not require a separate patterning step to define the electrodes.

For purposes of this invention, the term "oxide" layer is used generally to refer to a layer of silicon dioxide, and the silicon dioxide may be undoped or doped, for example, with boron, phosphorous, or both, to form for example borophosphosilicate glass (BPSG), and phosphosilicate glass (PSG). The silicon dioxide layers may be grown or deposited by conventional techniques.

SUMMARY OF THE INVENTION

It is therefore an object of the present invention to provide a capacitor structure which does not require a separate patterning step to define the electrodes.

It is a further object to provide a structure which is useful for forming a discontinuous film in one process step.

It is a further object to provide such a structure which is feasible for routine manufacturing.

In accordance with the above listed and other objects, an adherent separator structure is provided with a post projecting from a surface which may be a substrate, and a separator adhering to the post, the separator spaced a distance above the surface. A discontinuous film is then formed in a single process step having a first portion on the surface and a second portion on the post, the discontinuity proximate to and caused by the separator. The structure is made into a stacked capacitor with the second (post) portion of the discontinuous film being the bottom electrode, by forming a continuous dielectric layer on the bottom electrode and a continuous top electrode layer on the dielectric layer.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

The present invention is described herein in the context of a stacked capacitor merely as a specific example, and is not meant to limit applicability of the invention to such. Those skilled in the art will understand that the invention is broadly applicable to any structure or method in which it is desirable to have a self-defining discontinuous film structure with a post projecting from a surface, a separator attached to the post, and the separator not in contact with the substrate. A discontinuous film may then be formed having a first portion on the surface and a second portion on the post such that the discontinuity is proximate to and caused by the separator.

Figure 1A:
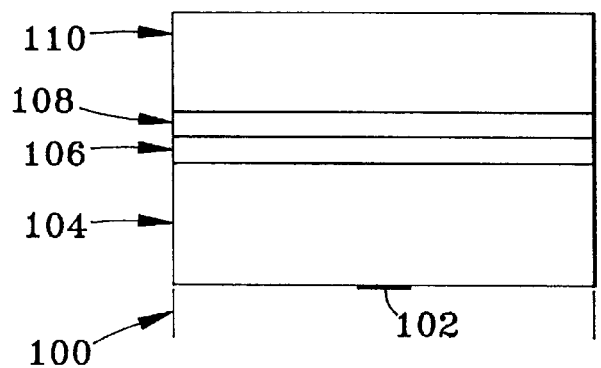
FIG. 1a–1h are sectional views of the processing steps to manufacture the capacitor structure, in accordance with the present invention.

In FIG. 1a, a substrate 100 with a contact region 102 has formed thereon a layer of oxide 104. Note that for certain applications of the capacitor structure to be formed, other circuit elements such as word line and bit line contacts may be fabricated prior to and below the capacitor, within substrate 100 or oxide layer 104.

Figure 1B:
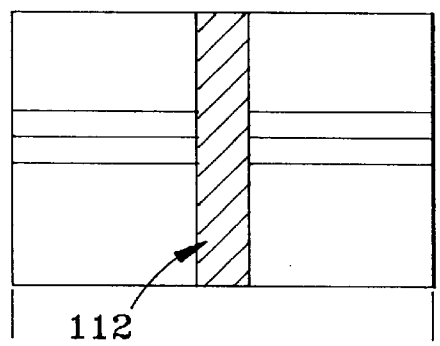
Figure 1C:
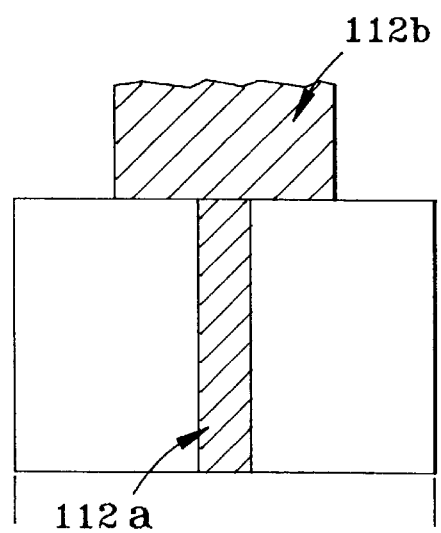

Following layer 104, a first disposable layer 106, a separator layer 108, and a second disposable layer 110, are formed as shown. The stack is patterned by forming a hole extending down to contact region 102. A conductive material, for example in-situ doped polysilicon, tungsten, titanium, or various silicides including tungsten and titanium silicides, is deposited for example by low pressure chemical vapor deposition (LPCVD) followed by planarization to form post 112 projecting from oxide 104 in FIG. 1b. Note that post 112 may or may not have a portion below the surface of the oxide; both are within the scope of the term "projecting from." For structural strength, it is preferable to have a portion below the surface. Alternatively, post 112 can be formed of more than one material in a multi-stage deposition process, resulting in an exemplary structure shown in FIG. 1c with a first portion 112a below the oxide surface and a second portion 112b on top of the first. Separator layer 108 may be an insulator such as $SiO_2$ (doped or undoped), SiN, diamond-like carbon (DLC) or a semi-conductor such as Si, Ge, SiGe, and is preferably an oxide or a nitride. First disposable layer 106 may be formed from any material that is selectively removable with respect to separator layer 108 and post 112, for example an oxide or nitride. Second disposable layer 110 may be formed from any material that is selectively removable with respect to separator layer 108, post 112, and oxide 104, for example an oxide or a nitride.

Figure 1F:
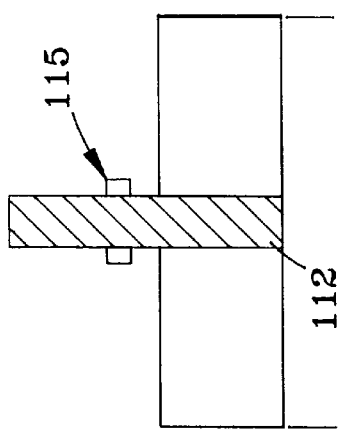
Figure 1E:
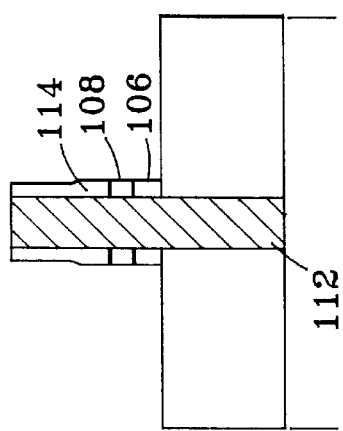
Figure 1D:
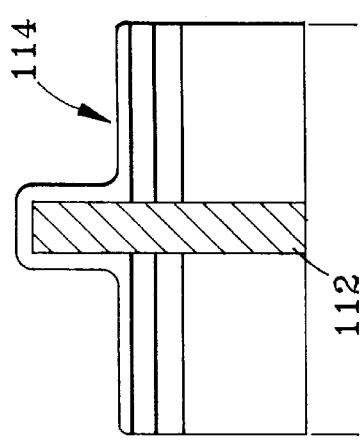

In FIG. 1d, second disposable layer 110 is removed by a selective process, either wet or dry, and a third disposable layer 114 is conformally deposited for example by chemical vapor deposition (CVD) or plasma enhanced CVD (PECVD), or a spin-on coating to yield the structure as shown. Third disposable layer 114 may be any material such as an oxide, nitride, or organic. In FIG. 1e, first disposable layer 106, separator layer 108, and third disposable layer 114 are patterned to form a layered sidewall spacer for example by reactive ion etching (RIE), and first disposable layer 106 and third disposable layer 114 are removed by an isotropic etch to leave a separator 115 adhering to post 112 in FIG. 1f.

Figure 1H:
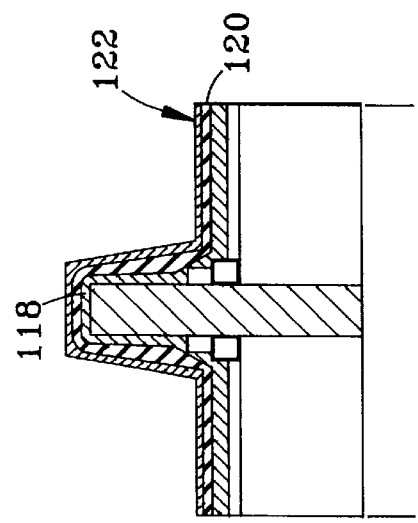
Figure 1G:
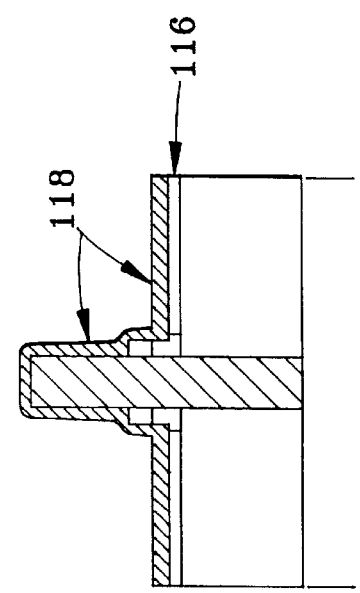

With separator 115 complete, formation of the stacked capacitor can begin as shown in FIG. 1g. An optional barrier layer 116 is first deposited, followed by a bottom electrode layer 118. Layers 116 and 118 are each deposited in a single process step for example by a sputter process or CVD, which may be made more directional for example by collimation. Barrier layer 116 may be for example $CoSi_2$, $WSi_x$, TaSiN, TiAlN and serves to isolate post 112 from bottom electrode 118, which is for example Pt, Ir, Pd, or $IrO_2$ and is preferably a noble metal or noble metal oxide for high dielectric constant capacitor applications.

It is important to note that barrier layer 116 and bottom electrode layer 118 are discontinuous, and that the discontinuity is caused by separator 115. Layers 116 and 118 can also be characterized as non-patterned, or discontinuous-as-deposited. Therefore adjacent capacitors are prevented from shorting together. Thus the bottom electrode is self-forming or self-defining. Optimally, separator 115 is a distance above substrate 100 of greater than or equal to the thickness of the discontinuous film to be deposited. Also, the thickness of separator 115 is optimally a thickness greater than or equal to two times the thickness of the discontinuous film to be deposited. These dimensions assume a non-directional depostion process for layers 116 and 118; if a more directional process is used, then separator 115 may be thinner and closer to substrate 100, for example half the non-directional dimensions.

The capacitor is completed in FIG. 1h by depositing a dielectric layer 120 followed by a top electrode layer 122. Layers 120 and 122 are deposited by sputtering or CVD, for example. Dielectric 120 is any suitable capacitor dielectric, and is preferably a high-dielectric constant material (i.e. with a dielectric constant over 20) such as $(Ba,Sr)TiO_3$ (BST). Top electrode 122 is preferably from the same group of materials as bottom electrode 118.

In summary, a capacitor structure is provided which does not require a separate patterning step to define the bottom electrode. More generally, a structure is provided which is useful for forming a discontinuous film in one process step, and is thus feasible for routine semiconductor manufacturing.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. An adherent separator structure useful for creating a self-defining discontinuous film, comprising:
   a post projecting from a surface;
   a separator adhering to the post, the separator being spaced a distance above the surface; and
   a non-patterned discontinuous film having a first portion on the surface and a second portion on the post, the discontinuity proximate the separator.

2. The structure of claim 1 wherein the structure is a capacitor, and the discontinuous film is a bottom electrode of the capacitor, further comprising:

a continuous dielectric layer on the bottom electrode; and
   a continuous top electrode layer on the dielectric layer.

3. The structure of claim 2 wherein the post is conductive.

4. The structure of claim 3 wherein the post is doped polysilicon.

5. The structure of claim 1 wherein the separator layer is a material selected from the group consisting of insulators and semiconductors.

6. The structure of claim 1 wherein the separator layer is an insulator.

7. The structure of claim 6 wherein the separator layer is an oxide.

8. The structure of claim 6 wherein the separator layer is a nitride.

9. The structure of claim 6 wherein the separator layer is a material selected from the group consisting of undoped $SiO_2$, doped $SiO_2$, SiN, and diamond-like carbon.

10. The structure of claim 2 wherein the bottom electrode is a material selected from the group consisting of noble metals and noble metal oxides.

11. The structure of claim 10 wherein the bottom electrode is platinum.

12. The structure of claim 2 wherein the dielectric layer is a high-dielectric constant material.

13. The structure of claim 12 wherein the dielectric layer is $(Ba,Sr)TiO_3$.

14. The structure of claim 3 further comprising a discontinuous barrier layer between the post and the bottom electrode layer.

15. The structure of claim 14 wherein the barrier layer is a material selected from the group consisting of $CoSi_2$, $WSi_x$, TaSiN, and TiAlN.

16. The structure of claim 1 wherein the distance by which the separator is spaced above the surface is at least equal to a thickness of the discontinuous film.

17. The structure of claim 1 wherein the distance by which the separator is spaced above the surface is approximately equal to a thickness of the discontinuous film.

18. The structure of claim 1 wherein the separator has a thickness at least equal to two times a thickness of the discontinuous film.

19. The structure of claim 1 wherein the separator has a thickness approximately equal to two times a thickness of the discontinuous film.

* * * * *